(12) United States Patent
Schultz

(10) Patent No.: US 11,211,330 B2
(45) Date of Patent: Dec. 28, 2021

(54) STANDARD CELL LAYOUT ARCHITECTURES AND DRAWING STYLES FOR 5NM AND BEYOND

(71) Applicant: Advanced Micro Devices, Inc., Sunnyvale, CA (US)

(72) Inventor: Richard T. Schultz, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/636,245

(22) Filed: Jun. 28, 2017

(65) Prior Publication Data

US 2018/0315709 A1   Nov. 1, 2018

Related U.S. Application Data

(60) Provisional application No. 62/492,702, filed on May 1, 2017.

(51) Int. Cl.
*H01L 23/535* (2006.01)
*H01L 29/786* (2006.01)
(Continued)

(52) U.S. Cl.
CPC ............ *H01L 23/535* (2013.01); *G06F 30/39* (2020.01); *G06F 30/392* (2020.01); *H01L 21/76895* (2013.01); *H01L 27/0207* (2013.01); *H01L 29/41733* (2013.01); *H01L 29/42392* (2013.01); *H01L 29/458* (2013.01);
(Continued)

(58) Field of Classification Search
CPC ............ G06F 17/5072; G06F 17/5068; H01L 23/535; H01L 29/78696; H01L 29/78651; H01L 29/4966; H01L 29/458; H01L 29/42392; H01L 29/41733; H01L 27/0207; H01L 21/76895
See application file for complete search history.

(56) References Cited

U.S. PATENT DOCUMENTS 4,851,892 A   7/1989  Anderson et al.
5,591,999 A * 1/1997  Momodomi .......... H01L 27/115
                                                                257/315
(Continued)

OTHER PUBLICATIONS

Xie et al., "5nm FinFET Standard Cell Library Optimization and Circuit Synthesis in Near- and Super-Threshold Voltage Regimes," 2014 IEEE Computer Society Annual Synposium on VLSI, pp. 424-429.*

(Continued)

*Primary Examiner* — Allen L Parker
*Assistant Examiner* — Charles N Ausar-El
(74) *Attorney, Agent, or Firm* — Kowert Hood Munyon Rankin and Goetzel PC; Rory D. Rankin

(57) ABSTRACT

A system and method for efficiently creating layout for a standard cell are described. A standard cell to be used for an integrated circuit uses a full trench silicide strap as drain regions for a pmos transistor and an nmos transistor. Multiple unidirectional routes in metal zero are placed across the standard cell where each route connects to a trench silicide contact. Power and ground connections utilize pins rather than end-to-end rails in the standard cell. Additionally, intermediate nodes are routed in the standard cell with unidirectional routes.

20 Claims, 12 Drawing Sheets

(51) Int. Cl.

| | | |
|---|---|---|
| *H01L 29/423* | (2006.01) | |
| *H01L 29/45* | (2006.01) | |
| *H01L 29/417* | (2006.01) | |
| *H01L 21/768* | (2006.01) | |
| *H01L 27/02* | (2006.01) | |
| *H01L 29/49* | (2006.01) | |
| *G06F 30/39* | (2020.01) | |
| *G06F 30/392* | (2020.01) | |
| *H01L 21/8234* | (2006.01) | |
| *H01L 21/8238* | (2006.01) | |

(52) U.S. Cl.
CPC .... *H01L 29/4966* (2013.01); *H01L 29/78651* (2013.01); *H01L 29/78696* (2013.01); *H01L 21/823475* (2013.01); *H01L 21/823807* (2013.01); *H01L 21/823871* (2013.01)

(56) References Cited

U.S. PATENT DOCUMENTS

| | | | |
|---|---|---|---|
| 6,100,101 A | 8/2000 | Marathe et al. | |
| 6,242,767 B1 | 6/2001 | How et al. | |
| 6,609,242 B1 | 8/2003 | Slade | |
| 7,064,074 B2* | 6/2006 | van Bentum | H01L 21/74 257/E21.537 |
| 7,737,482 B2* | 6/2010 | Cheng | H01L 27/1087 257/301 |
| 8,185,855 B2 | 5/2012 | Kanari | |
| 8,264,007 B2 | 9/2012 | Becker et al. | |
| 8,356,268 B2 | 1/2013 | Becker et al. | |
| 8,513,978 B2* | 8/2013 | Sherlekar | G06F 30/394 326/101 |
| 8,561,003 B2* | 10/2013 | Kawa | H01L 27/0207 438/129 |
| 8,680,626 B2* | 3/2014 | Smayling | H01L 21/76897 257/401 |
| 9,400,862 B2* | 7/2016 | Kawa | G06F 17/5072 |
| 9,431,383 B2* | 8/2016 | Baek | H01L 29/785 |
| 9,460,259 B2* | 10/2016 | Baek | G06F 17/5072 |
| 9,502,351 B1* | 11/2016 | Sahu | H01L 27/092 |
| 9,553,028 B2* | 1/2017 | Xie | H01L 21/76885 |
| 9,589,847 B1 | 3/2017 | Chi et al. | |
| 9,633,987 B2* | 4/2017 | Smayling | H01L 27/0207 |
| 9,659,939 B1* | 5/2017 | Cao | H01L 27/10829 |
| 9,691,768 B2* | 6/2017 | Moroz | H01L 27/092 |
| 9,704,995 B1* | 7/2017 | Schultz | H01L 29/0673 |
| 9,837,398 B1* | 12/2017 | Rowhani | H01L 27/11807 |
| 9,837,437 B2* | 12/2017 | Baek | H01L 27/11807 |
| 9,881,926 B1 | 1/2018 | Basker et al. | |
| 2001/0015464 A1 | 8/2001 | Tamaki | |
| 2002/0069396 A1 | 6/2002 | Bhattacharya et al. | |
| 2003/0023937 A1 | 1/2003 | McManus et al. | |
| 2005/0045916 A1 | 3/2005 | Kim | |
| 2007/0063244 A1* | 3/2007 | Ho | H01L 21/84 257/301 |
| 2007/0284619 A1 | 12/2007 | Kanno et al. | |
| 2008/0283925 A1* | 11/2008 | Berthold | H01L 21/845 257/368 |
| 2010/0095263 A1 | 4/2010 | Frederick | |
| 2010/0127333 A1* | 5/2010 | Hou | H01L 27/0207 257/368 |
| 2010/0287518 A1* | 11/2010 | Becker | G06F 17/5072 716/123 |
| 2012/0313148 A1* | 12/2012 | Schultz | H01L 21/76895 257/288 |
| 2013/0026572 A1* | 1/2013 | Kawa | H01L 27/0207 257/347 |
| 2013/0119474 A1* | 5/2013 | Schultz | H01L 21/76895 257/368 |
| 2013/0146986 A1* | 6/2013 | Rashed | H01L 21/823418 257/369 |
| 2013/0154128 A1 | 6/2013 | Wang et al. | |
| 2013/0295756 A1 | 11/2013 | Yuan et al. | |
| 2013/0313513 A1 | 11/2013 | Cappellani et al. | |
| 2013/0334613 A1* | 12/2013 | Moroz | G06F 17/5072 257/401 |
| 2014/0197494 A1* | 7/2014 | Schultz | H01L 21/76897 257/368 |
| 2014/0252650 A1 | 9/2014 | Utsumi | |
| 2015/0048425 A1 | 2/2015 | Park et al. | |
| 2015/0052494 A1* | 2/2015 | Tarabbia | G06F 17/5077 716/135 |
| 2015/0069531 A1* | 3/2015 | Naczas | H01L 23/535 257/410 |
| 2015/0214113 A1 | 7/2015 | Bouche et al. | |
| 2015/0269302 A1 | 9/2015 | Katta et al. | |
| 2015/0270176 A1 | 9/2015 | Xie et al. | |
| 2015/0302917 A1* | 10/2015 | Grover | G11C 11/412 365/51 |
| 2015/0333008 A1* | 11/2015 | Gupta | H01L 27/0207 257/369 |
| 2016/0163644 A1* | 6/2016 | Woo | H01L 27/0924 257/401 |
| 2016/0284705 A1 | 9/2016 | Chung | |
| 2017/0125292 A1* | 5/2017 | Greene | H01L 21/76897 |
| 2017/0263506 A1* | 9/2017 | Bouche | H01L 21/823871 |
| 2017/0294448 A1 | 10/2017 | Debacker et al. | |
| 2017/0323902 A1* | 11/2017 | Zeng | H01L 23/485 |
| 2017/0365621 A1* | 12/2017 | Becker | H01L 29/42372 |
| 2017/0371995 A1* | 12/2017 | Correale, Jr. | G06F 17/5072 |
| 2017/0373090 A1* | 12/2017 | Correale, Jr. | H01L 27/11807 |
| 2018/0033701 A1* | 2/2018 | Bouche | G06F 17/5072 |
| 2018/0090440 A1* | 3/2018 | Schultz | H01L 23/5226 |
| 2018/0218981 A1* | 8/2018 | Lin | H01L 27/0207 |
| 2018/0308796 A1 | 10/2018 | Peng et al. | |
| 2018/0314785 A1 | 11/2018 | Schultz | |
| 2019/0355829 A1 | 11/2019 | Wang et al. | |

OTHER PUBLICATIONS

Cui et al., "7nm FinFET Standard Cell Layout Characterization and Power Density Prediction in Near- and Super-Threshold Voltage Regimes," Green Computing Conference (IGCC), 2014 International; Nov. 3-5, 2014, Dallas, Texas.*

International Search Report and Written Opinion in International Application No. PCT/US2018/029767, dated Jul. 11, 2018, 14 pages.

International Search Report and Written Opinion in International Application No. PCT/US2018/029760, dated Jul. 16, 2018, 16 pages.

Non-Final Office Action in U.S. Appl. No. 15/636,278, dated Apr. 5, 2019, 12 pages.

Final Office Action in U.S. Appl. No. 15/636,278, dated Nov. 18, 2019, 16 pages.

Non-Final Office Action in U.S. Appl. No. 15/636,278, dated May 14, 2020, 15 pages.

Wachnik et al., "Practical Benefits of the Electromigration Short-Length Effect, Including a New Design Rule Methodology and an Electromigration Resistant Power Grid with Enhanced Wireability", 2000 Symposium on VLSI Technology Digest of Technical Papers, Jun. 13-15, 2000, pp. 220-221.

Final Office Action in U.S. Appl. No. 15/636,278, dated Dec. 23, 2020, 26 pages.

Communication pursuant to Article 94(3) EPC in European Application No. 18724101.3, dated Jul. 26, 2021, 9 pages.

Communication pursuant to Article 94(3) EPC in European Application No. 18724699.6, dated Jul. 7, 2021, 9 pages.

Non-Final Office Action in U.S. Appl. No. 15/636,278, dated Jun. 10, 2021, 29 pages.

* cited by examiner

STANDARD CELL LAYOUT ARCHITECTURES AND DRAWING STYLES FOR 5NM AND BEYOND

CROSS REFERENCE TO RELATED APPLICATIONS

This application claims priority to Provisional Patent Application Ser. No. 62/492,702, entitled "Standard Cell Layout Architectures and Drawing Styles For 5NM and Beyond", filed May 1, 2017, the entirety of which is incorporated herein by reference.

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that limit potential benefits. For example, capacitive coupling, electromigration, leakage currents and processing yield are some issues which affect the placement of devices and the routing of signals across an entire die of a semiconductor chip. Thus, these issues have the potential to delay completion of the design and affect the time to market.

In order to shorten the design cycle for semiconductor chips, manual full-custom designs are replaced with automation where possible. A designer provides a description of a functional unit or a complex gate in a high-level description language such as Verilog, VHDL and so on. A synthesis tool receives the logic description and provides the logical netlist. The logical netlist is used by a place-and-route (PNR) tool to provide physical layout. The place-and-route tool uses a cell layout library to provide the physical layout.

The cell layout library includes multiple standard cell layouts for providing the various functionalities used by the semiconductor chip. In some cases, a standard cell layout is created manually. Therefore, each new standard cell layout or each original standard cell layout being modified is created manually. In other cases, the rules used by the place-and-route tool are adjusted to automate the cell creation. However, the automated process at times does not satisfy each of the rules directed at performance, power consumption, signal integrity, process yield, both local and external signal routing including internal cross coupled connections, height and width cell dimensions matching other cells, pin access, power rail design and so on. Therefore, designers manually create these cells to achieve better results for the multiple characteristics or rewrite the rules for the place-and-route tool.

In view of the above, efficient methods and systems for laying out standard cells are desired.

BRIEF DESCRIPTION OF THE DRAWINGS

The advantages of the methods and mechanisms described herein may be better understood by referring to the following description in conjunction with the accompanying drawings, in which.

Figure 1:
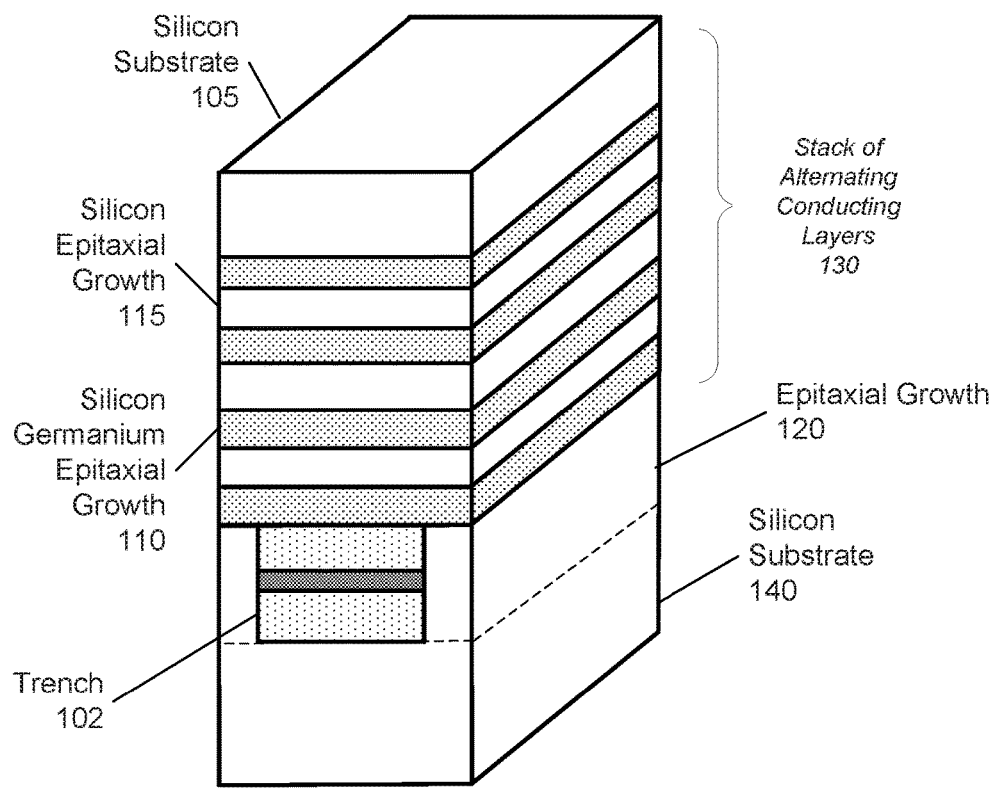
FIG. 1 is a generalized diagram of a cross-sectional view of a portion of a semiconductor device being fabricated.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for efficiently creating layout for a standard cell are contemplated. In an embodiment, a standard cell to be used for an integrated circuit includes multiple transistors as well as one or more "full trench silicide straps." As used herein, a full trench silicide strap is a single, uninterrupted, trench silicide contact formed as a drain region of at least two separate transistors—in contrast to connecting two separate transistor drain regions via an additional conductive layer. In other words, a full trench silicide strap is a single conductive layer that is physically uninterrupted by another conductive layer as it traverses at least two different active regions. In addition, the standard cell includes one or more trench silicide contacts, each is formed as a source region or a drain region of a respective transistor of the multiple transistors in the standard cell.

In an embodiment, the full trench silicide strap is used as a single node shared by a pmos transistor and an nmos transistor. In various embodiments, the single node is an intermediate output node within the standard cell where the value of the output node is used within the standard cell but not used outside of the standard cell. In an embodiment, a self-aligned gate and local interconnect process in addition to a gate open contact process is used to create the full trench silicide strap. In various embodiments, using the full trench silicide strap removes the use of any further connections beyond the trench silicide to electrically connect the drain regions of the pmos transistor and the nmos transistor. For example, no other conductive layer and corresponding contacts or vias are used.

In an embodiment, the full trench silicide strap is a unidirectional signal route between the pmos transistor and the nmos transistor. As used herein, a unidirectional signal route is a signal route with no bends. In contrast, signal routes with bends, such as L-shapes and other angles for the routes, are referred to as bidirectional routes. Bidirectional routes create a significant on-die area penalty as well as reduce the number of tracks used for routing signals. In one example, self-aligned double patterned (SADP) breaks are created for the bidirectional signal routes. The created separation, which is referred to as an SADP break, causes an appreciable area penalty.

Taking advantage of relatively aggressive reductions in features in semiconductor processing for semiconductor structures, multiple metal zero unidirectional routes, which are to be used as local interconnect, are placed across the standard cell where each route connects to one of the multiple trench silicide contacts. Accordingly, the use of higher level metal layers and the corresponding contacts in the standard cell is reduced. Power and ground connections utilize pins rather than end-to-end rails in the standard cell. Additionally, intermediate nodes are routed in the standard cell with unidirectional tracks.

In the following description of creating standard cell layout, FIGS. 1-4 show cross-sectional views of a semiconductor device being fabricated. Although particular fabrication techniques and materials are described, any of a variety of methods can be used. The semiconductor device being shown is used to illustrate an example of a device used in a complex gate, such as a multiplexer, where the standard cell layout is shown in FIGS. 5-13. Turning now to FIG. 1, a generalized block diagram of a cross-sectional view of a portion of a semiconductor device being fabricated is shown. Here, silicon semiconducting epitaxial growth layer 120 is on top of the silicon substrate 140. The stack 130 of alternating semiconductor conduction layers are shown on top of the top-most semiconducting layer 120, which is the silicon semiconducting epitaxial growth layer. Alternating conduction layers are grown on top of the silicon substrate 105 and then flipped over. In some embodiments, a silicon germanium semiconducting epitaxial growth layer 110 is grown first followed by a silicon semiconducting epitaxial growth layer 115, and then the layers 110 and 115 alternate. In other embodiments, the stack 130 additionally includes a gallium arsenide semiconducting layer. Other semiconducting layers for the stack are possible and contemplated. A dashed line is used to show a bonding surface.

In various embodiments, the trench 102 in the silicon semiconducting epitaxial growth layer 120 uses multiple layers of silicon dioxide 150, silicon nitride 160, and silicon dioxide 150, provide an insulating layer for the non-planar semiconductor device being fabricated. In other embodiments, a silicon nitride layer 160 is not used and the trench 102 is only filled with silicon dioxide 150 to provide the insulating layer for the non-planar semiconductor device being fabricated. In some embodiments, each layer within the trench 102 has a separate and different thickness. In other embodiments, multiple layers within the trench 102 have a same thickness.

Figure 2:
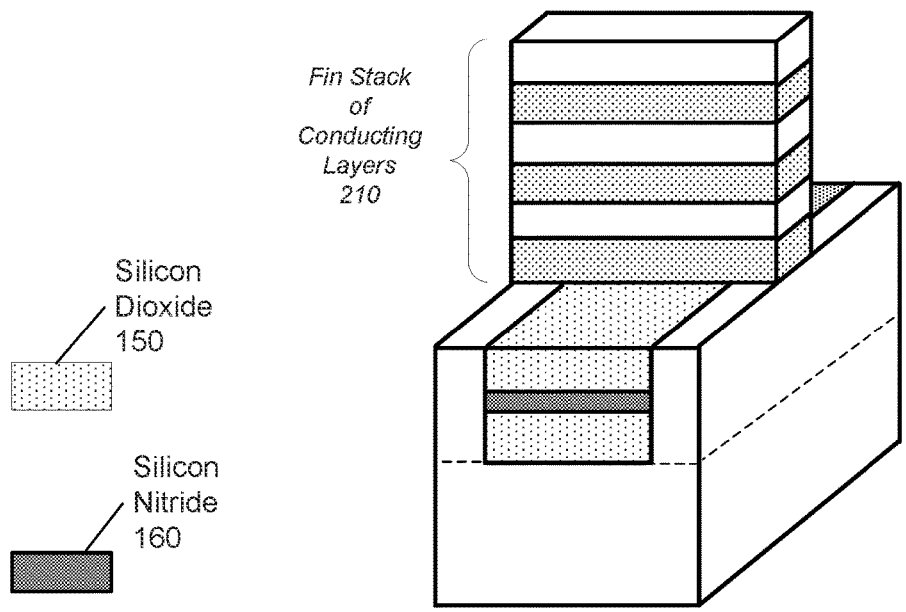
FIG. 2 is a generalized diagram of another cross-sectional view of a portion of a semiconductor device being fabricated.

Referring now to FIG. 2, a generalized block diagram of another cross-sectional view of a portion of a semiconductor device being fabricated is shown. Components described earlier are numbered identically. Here, a Fin stack 210 of alternating semiconducting layers is created from the previous stack 130 of alternating semiconducting layers. Silicon Fins with a relatively small pitch but with dimensions suitable for field effect transistors are formed by multiple processes. In various embodiments, the silicon Fins are formed with a sidewall image transfer (SIT) process. In other embodiments, the silicon Fins are formed with extreme ultraviolet (EUV) lithography. In yet other embodiments, the silicon Fins are formed by directed self-assembly (DSA) patterning via chemoepitaxy or self-aligned customization.

Figure 3:
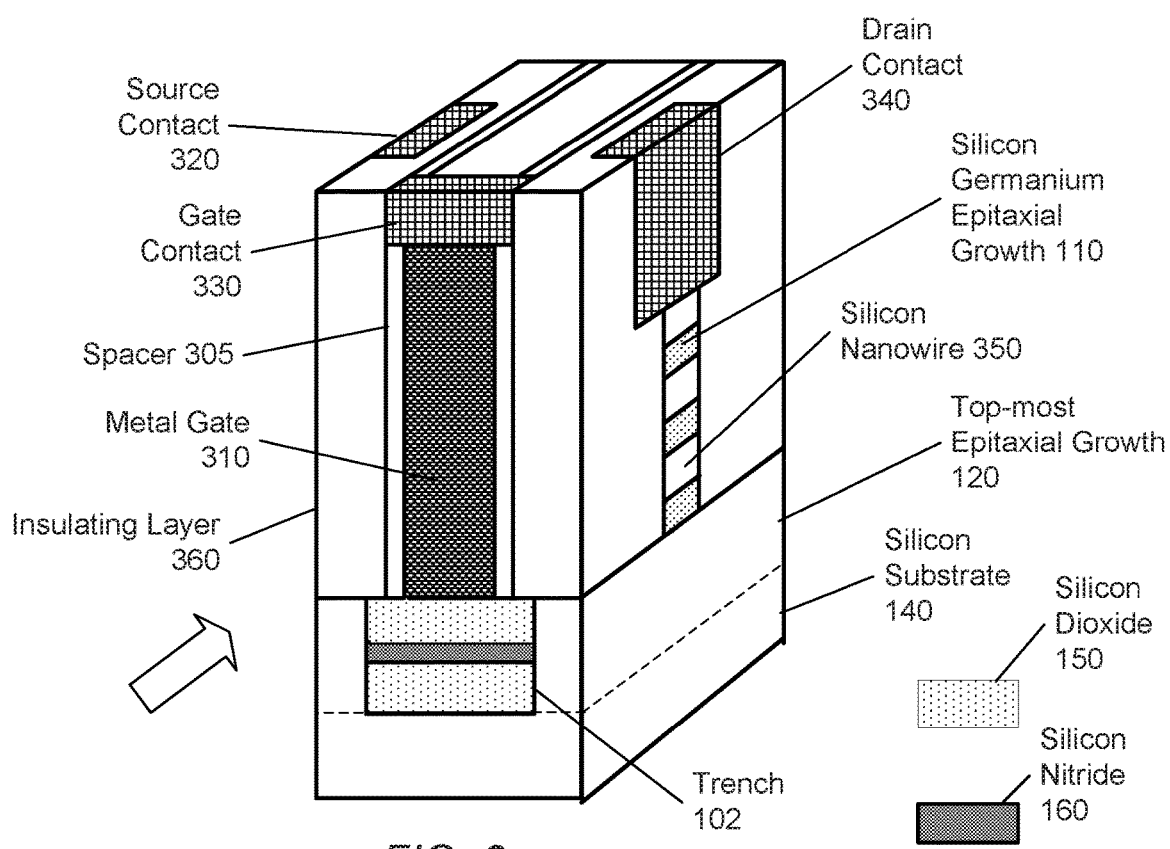
FIG. 3 is a generalized diagram of another cross-sectional view of a portion of a semiconductor device being fabricated.

Referring now to FIG. 3, a generalized block diagram of another cross-sectional view of a portion of a semiconductor device being fabricated is shown. Components described earlier are numbered identically. As shown, a spacer 305 is formed in the inner walls of the insulating layer 360 by being deposited and etched. In various embodiments, the spacer 305 includes silicon nitride. In other embodiments, the spacer 305 is a combination of silicon dioxide and silicon nitride. A relatively thin silicon dioxide layer is grown on the silicon epitaxial growth layers 115 to provide silicon nanowires 350 in the gate region. In some examples, the silicon nanowires 350 have a thickness of 5-3 nanometers, whereas the gate silicon dioxide layer (shell) has a thickness ranging from 1 nanometer to 10-15 angstroms. A dry oxidation processing step at an elevated temperature is used to form the relatively thin oxide shell on the silicon nanowires 350. After this, a high-k dielectric, such as hafnium oxide (HfO2), can be deposited on the oxide shell on the nanowires 350 using an atomic layer deposition (ALD). The high-k dielectric may also be referred to as a high-k film.

Gate metal material 310 has been deposited followed by CMP steps to polish the gate metal 310. In various embodiments, titanium nitride (TiN) is used for the gate metal 310. The gate metal 310 is provided around the nanowires 350. The stack of silicon dioxide layers 150 and the nitride layer 160 in the trench 102 provides a local silicon on insulator (SOI) where the gate region is isolated from the silicon substrate 140. Therefore, the capacitive coupling between the gate region and the silicon substrate 140 is reduced. However, the local SOI does not span the length of the semiconductor device being fabricated as is done with typical SOI. Rather, the local SOI has the length L1 and is bounded by a site for a source region and a site for a drain region.

As shown, a source contact 320 for the source region, a gate contact 330 and a drain contact 340 for the drain region are formed. In some embodiments, silicide contacts are formed at both ends of the silicon nanowires providing low resistive contacts 320 and 340 for the source region and the drain region. Between depositing the metal gate 310 and forming the contacts 320-340, the insulating layer 360 is etched away followed by the source region and the drain region are formed by an implantation process. Afterward, another insulating layer is deposited, but this time around the alternating portions of the conduction layers 110 and 115 outside of the silicon nitride spacers.

Figure 4:
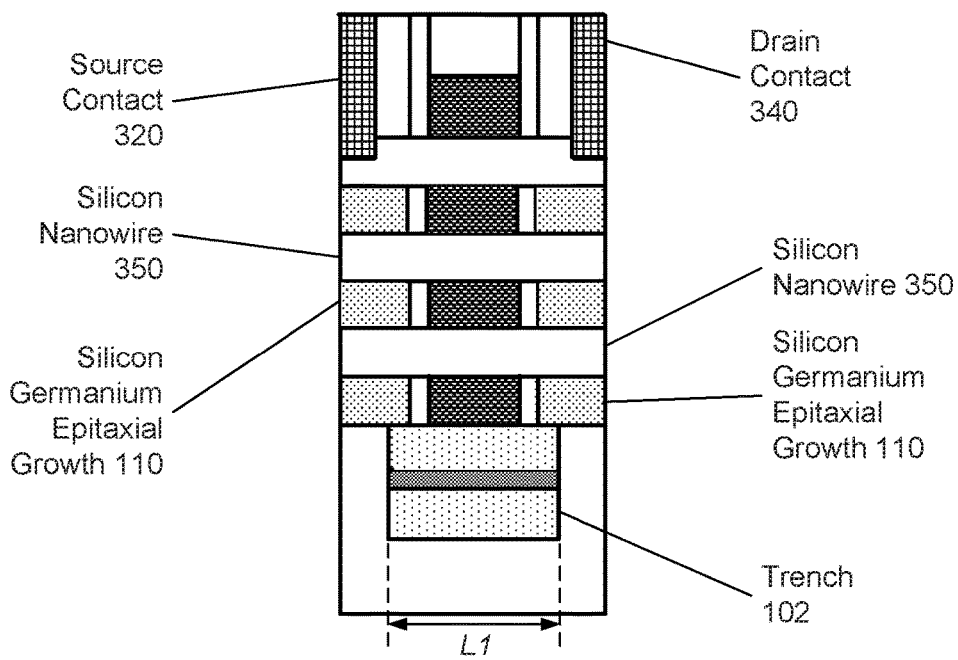
FIG. 4 is a generalized diagram of another cross-sectional view of a portion of a semiconductor device being fabricated.

Turning now to FIG. 4, a generalized block diagram of a cross-sectional view from the front of the semiconductor device being fabricated is shown. Components described earlier are numbered identically. As shown, the silicon nanowires 350 are shown horizontally between the source region and the drain region. The metal gate 310 is shown throughout the gate region and around the nanowires 350 to provide a gate all around GAA) semiconductor device. As described earlier, the stack of silicon dioxide layers 150 and silicon nitride layer 160 in the trench 102 provides the local silicon on insulator (SOI) where the gate region is isolated from the silicon substrate 140.

It is noted that in some embodiments, the silicon germanium semiconducting layer 110 is selected to remain for building p-channel semiconductor devices. The silicon semiconducting layer 115 is selected to remain for building n-channel semiconductor devices. It is also noted that other materials may be used for the semiconducting layers. For example, gallium arsenide (GaAs) can be used for building n-channel semiconductor devices. In various embodiments, if the selected semiconducting layer to remain resides on top of the top-most semiconducting layer 120, then an additional trench is etched into the silicon dioxide layer 150 for depositing gate material 310. Otherwise, no additional trench is used.

Figure 5:
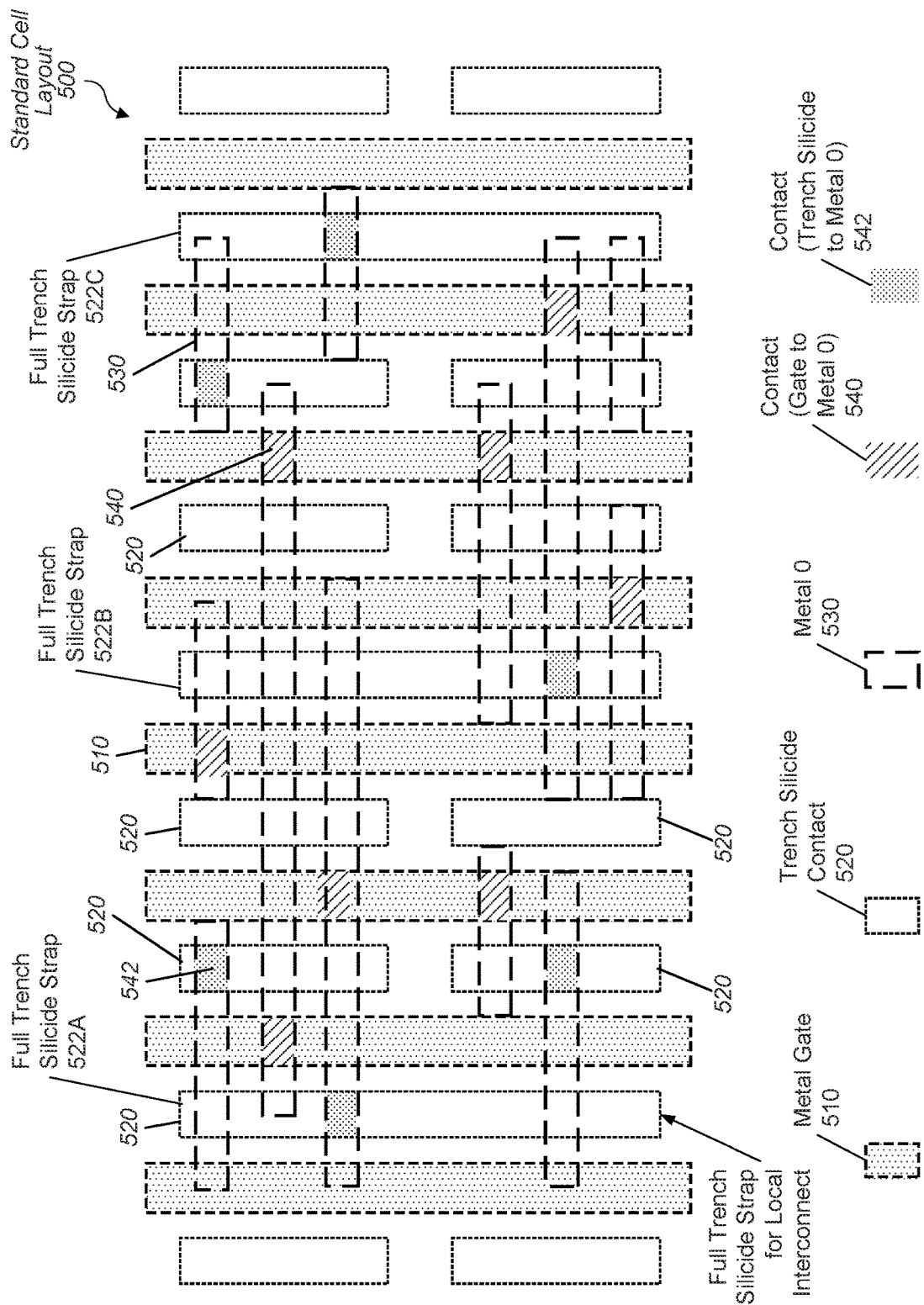
FIG. 5 is a generalized diagram of a top view of a standard cell layout for a six device multiplexer.

Turning now to FIG. 5, a generalized block diagram of a top view of a standard cell layout 500 is shown. Here, the active regions are not shown in the standard cell layout 500 for ease of illustration. The PMOS FETS (pfets) are at the top of the standard cell layout 500 and the NMOS FETS (nfets) are at the bottom of the standard cell layout 500. In the illustrated embodiment, the standard cell layout 500 is for a six device multiplexer. However, the layout techniques shown in FIGS. 5-13 can be used for a variety of other standard cells used for other complex gates and functional units. In some embodiments, the devices in the standard cell layout 500 are fabricated by one of the immersion lithography techniques, the double patterning technique, the extreme ultraviolet lithography (EUV) technique, and the directed self-assembly (DSA) lithography technique. In some embodiments, the EUV technique provides more flexibility relative to via and contact modules relative to other techniques.

In various embodiments, the devices (transistors) in the standard cell layout 500 are non-planar devices (transistors). Non-planar transistors are a recent development in semiconductor processing for reducing short channel effects. Tri-gate transistors, Fin field effect transistors (FETs) and gate all around (GAA) transistors are examples of non-planar transistors. Examples of fabrication techniques for non-planar devices were shown earlier in FIGS. 1-4. As shown, the standard cell layout 500 uses metal gate 510 in a vertical direction, trench silicide contacts 520 for the source and drain regions and as local interconnects in the vertical direction, metal 0 (M0 or Metal0) 530 for local interconnections in the horizontal direction, contacts 540 for connecting the metal gate 510 to Metal0 530 and contacts 542 for connecting the trench silicide contact 520 to Metal0 530.

As shown, starting from the left, each of the third, fourth, sixth and seventh columns in the standard cell layout 500 uses separate and physically disconnected trench silicide contacts 520. As shown, in the third column, a trench silicide contact 520 is a trench silicide contact formed from the top of the cell layout 500 and stops near the midpoint of the cell layout 500. Therefore, there is an interruption in the physical formation of the trench silicide contact 520 going from the top to the bottom of the cell layout 500. In the third column, another trench silicide contact 520 is formed from close to the midpoint of the cell layout 500 and ends at the bottom of the cell layout 500. Therefore, there is a physical interruption, or a physical break, between the top trench silicide contact 520 and the bottom trench silicide contact 520 in the third column. The third column uses two separate and physically disconnected trench silicide contacts 520. Each of these two trench silicide contacts 520 forms either a source region or a drain region of a respective transistor in the cell layout 500. In order to connect the source or drain region to another node, such as a region of another transistor, a contact and an additional metal layer is used.

In contrast, starting from the far left, each of the second, fifth and eighth columns use one of the full trench silicide straps 522A-522C for local interconnection. Each of the full trench silicide straps 522A-522C is a trench silicide contact formed in a physically uninterrupted manner from the top of the standard cell layout 500 where the pfet is located to the bottom of the cell layout 500 where the nfet is located. There is no break in each of the full trench silicide straps 522A-522C from the top to the bottom of the cell layout 500. Therefore, in each of the second, fifth and eighth columns, the standard cell layout 500 uses one of the full trench silicide straps 522A-522C as a single node shared by a pfet and an nfet.

Each of the full trench silicide straps 522A-522C is a trench silicide contact formed as a drain region of two separate transistors in the cell layout 500. In one example, the first transistor of the two transistors is the pfet at the top of the cell layout 500 in the third column and the second transistor of the two transistors is the nfet at the bottom of the cell layout 500 in the third column. The two transistors in the third column use the same one of the full trench silicide straps 522A-522C for routing the drain terminal connections in place of using two separate and disconnected trench silicide contacts 520, a contact and an additional metal layer.

The single shared nodes using a respective one of the full trench silicide straps 522A-522C are achieved without using contacts 542 and Metal0 530, and therefore, eliminate using Metal 2 in later cell connections. Each of the single shared nodes uses one of the full trench silicide straps 522A-522C which includes the trench silicide contact from the pfet to the nfet in a continuous manner, or with no physical breaks. Accordingly, the full trench silicide straps 522A-522C provide efficient cell signal routing. In one embodiment, a self-aligned gate and local interconnect process in addition to a gate open contact process is used to create the full trench silicide straps 522A-522C.

Figure 6:
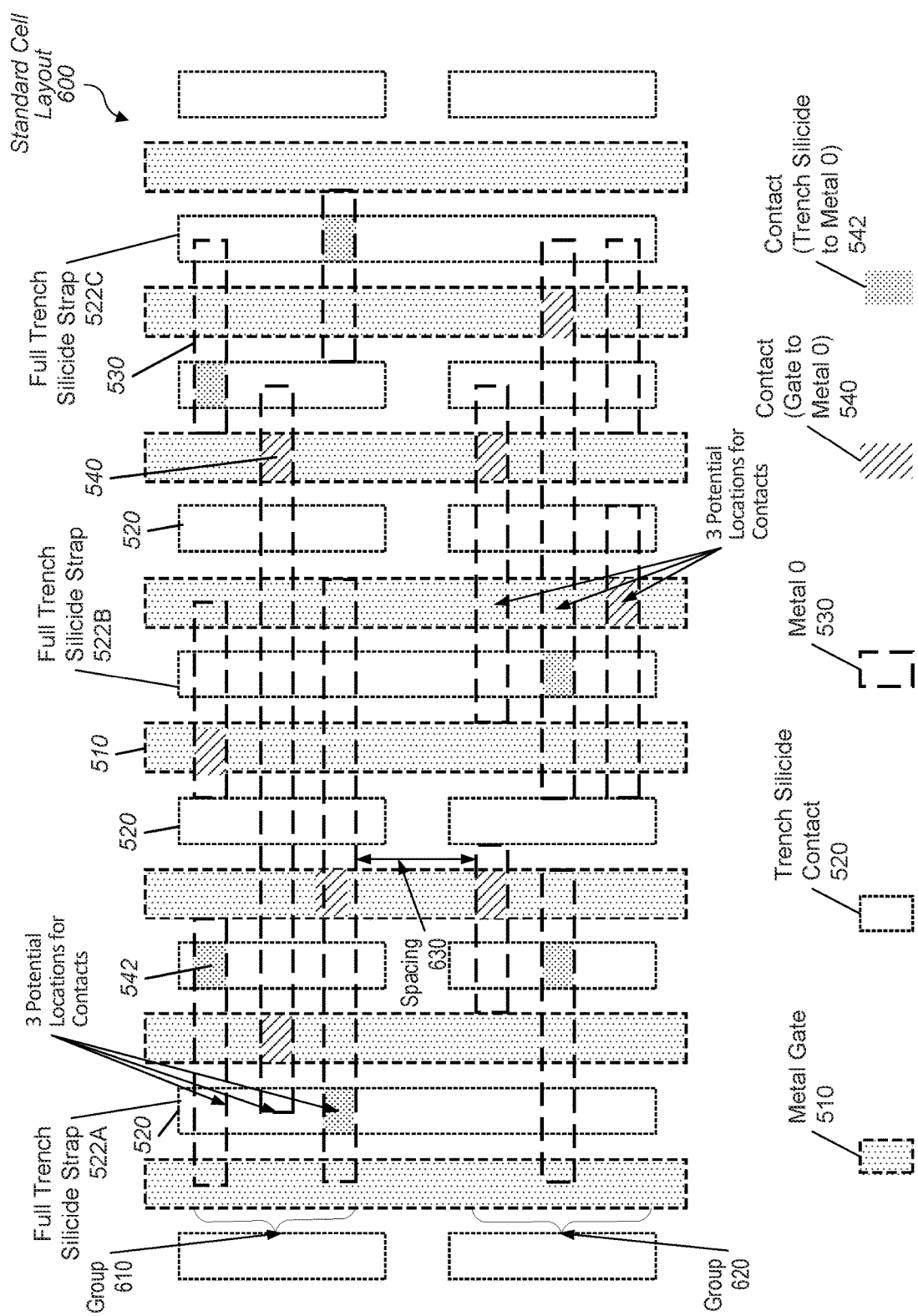
FIG. 6 is a generalized diagram of a top view of a standard cell layout for a six device multiplexer.

Referring to FIG. 6, a generalized block diagram of a top view of a standard cell layout 600 is shown. Layout elements described earlier are numbered identically. Here, the layout 600 is the same as the layout 500, but the horizontal groups 610 and 620 of Metal0 530 are highlighted. As shown, the layout 600 uses a group 610 at the top for routing three horizontal signal routes with the horizontal Metal0 530 local interconnect. In addition, the layout 600 uses a group 620 at the bottom for routing three horizontal signal routes with the horizontal Metal0 530 local interconnect. Although three horizontal tracks are shown for the groups 610 and 620, in other embodiments, any number of tracks are used for routing signals with the horizontal Metal0 530 in groups 610 and 620.

Each horizontal track in the groups 610 and 620 is capable of connecting to either a trench silicide contact 520 or one of the full trench silicide straps 522A-522C without any bends in its routing. Therefore, these horizontal tracks utilize unidirectional routes. In the illustrated embodiment, beginning at the left of the layout 600, the first, third, fourth, sixth, seventh and ninth trench silicon contacts are trench silicon contacts 520. Here, the number of horizontal tracks able to connect to these trench silicon contacts at the top and bottom of the layout 600 is three. Again, in other embodiments, another number of tracks are able to connect with contact 542. Areas outside the trench silicide contacts 520 are available for signal routing and power and ground connections using Metal0 530.

As shown, spacing 630 exists between the two groups 610 and 620, which can be used for additional signal routing tracks. In some embodiments, the extreme ultraviolet lithography (EUV) technique is used to provide the resolution of each of the width and the pitch of the horizontal Metal0 530 routes in the groups 610 and 620. The EUV technique uses an extreme ultraviolet wavelength to reach resolution below 40 nanometers. The extreme ultraviolet wavelength is approximately 13.5 nanometers. Relatively high temperature and high density plasma is used to provide the EUV beam. In other embodiments, the directed self-assembly (DSA) lithography technique used to provide the resolution of each of the width and the pitch. The DSA technique takes advantage of the self-assembling properties of materials to reach nanoscale dimensions.

In yet other embodiments, the resolution of each of the width and the pitch of the horizontal Metal0 530 routes in the groups 610 and 620 is set by the immersion lithography technique. Immersion lithography uses a liquid medium, such as purified water, between the lens of the imaging equipment and the wafer surface. Previously, the gap space was simply air. The resolution achieved by this technique is the resolution of the imaging equipment increased by the refractive index of the liquid medium. In some examples, the increased resolution falls above 80 nanometers.

In other embodiments, the double patterning technique is used to provide the resolution of each of the width and the pitch of the horizontal Metal0 530 routes in the groups 610 and 620. The double patterning technique uses immersion lithography systems to define features with resolution between 40 and 80 nanometers. Either of the self-aligned doubled patterning (SADP) technique or the litho-etch-litho-etch (LELE) technique is used. The double patterning technique counteracts the effects of diffraction in optical lithography, which occurs when the minimum dimensions of features on a wafer are less than the 193 nanometer wavelength of the illuminating light source. Other examples of techniques used to counteract the effects of diffraction in optical lithography are phase-shift masks, optical-proximity correction (OPC) techniques, optical equipment improvements and computational lithography.

When selecting between immersion lithography, double patterning, EUV and DSA techniques, and other techniques, cost is considered as the cost increases from immersion lithography to EUV. However, over time, the costs of these techniques adjust as well as additional and newer techniques are developed for providing relatively high resolution for the width and the pitch of the horizontal Metal0 530 routes in the groups 610 and 620. Accordingly, one of a variety of lithography techniques is used to provide relatively high resolution for the width and the pitch.

The relatively high resolution for the width and the pitch allows for 3 locations for contacts to be placed on the trench silicide contact 520 and the metal gate 510. These 3 locations are also referred to as the 3 hit points or the 3 spots for contacts to be placed on the trench silicide contact 520 and the metal gate 510. The 3 locations provide efficient signal and power routing. For example, the pfets at the top of layout 600 have access to three potential locations for contacts, and similarly, the nfets at the bottom of layout 600 have access to three potential locations for contacts. The flexibility offered by the three potential locations for contacts eliminates using other metal interconnects, such as Metal 1 or Metal 2, and the corresponding contacts for routing signals and power.

Figure 7:
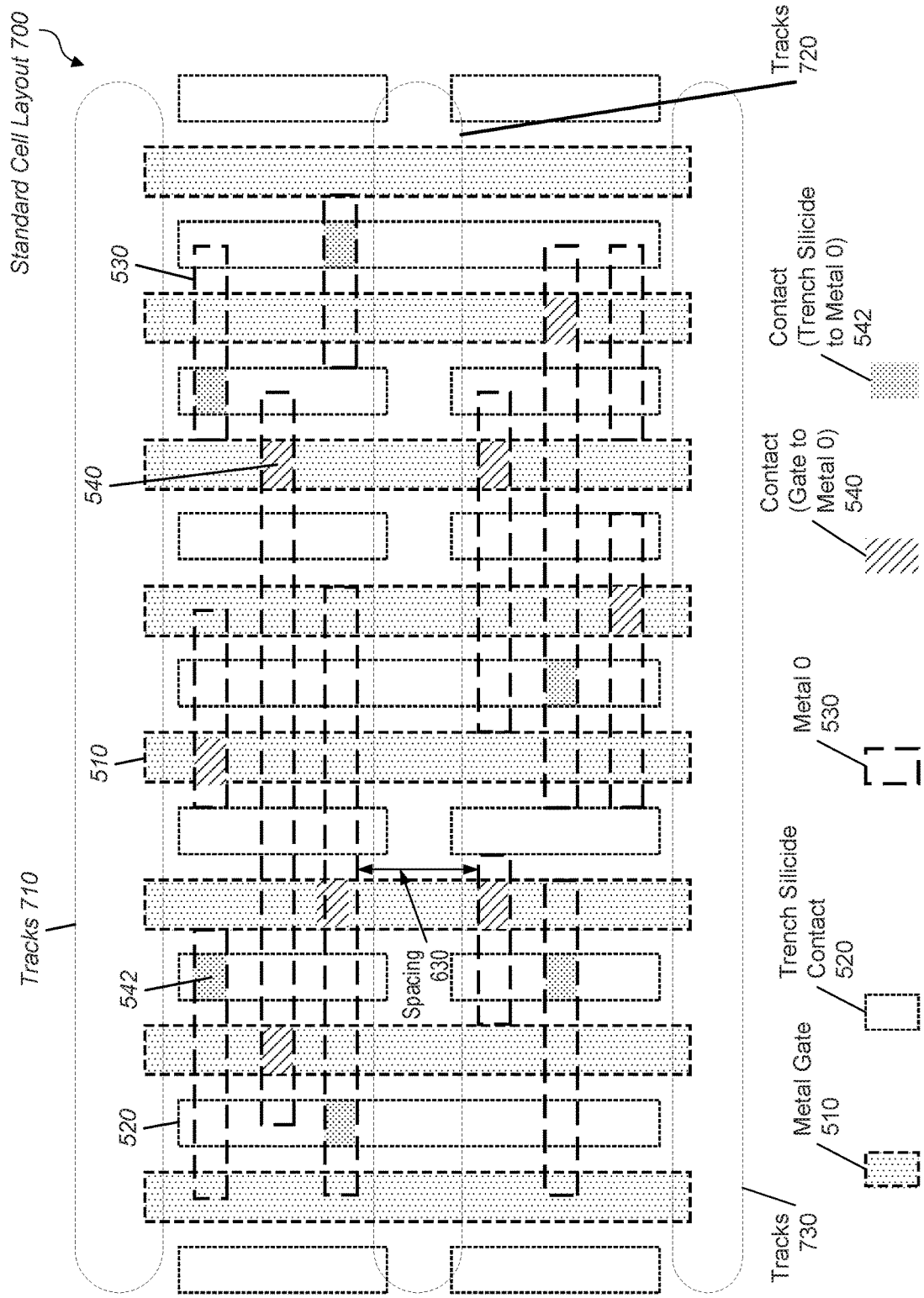
FIG. 7 is a generalized diagram of a top view of a standard cell layout for a six device multiplexer.

Referring to FIG. 7, a generalized block diagram of a top view of a standard cell layout 700 is shown. Layout elements described earlier are numbered identically. Here, the layout 700 is the same as the layouts 500 and 600, but the tracks 710, 720 and 730 are highlighted. The tracks 710, 720 and 730 are additional free tracks to use Metal0 530 for signal routing, power and ground connections, and pin connections.

Figure 8:
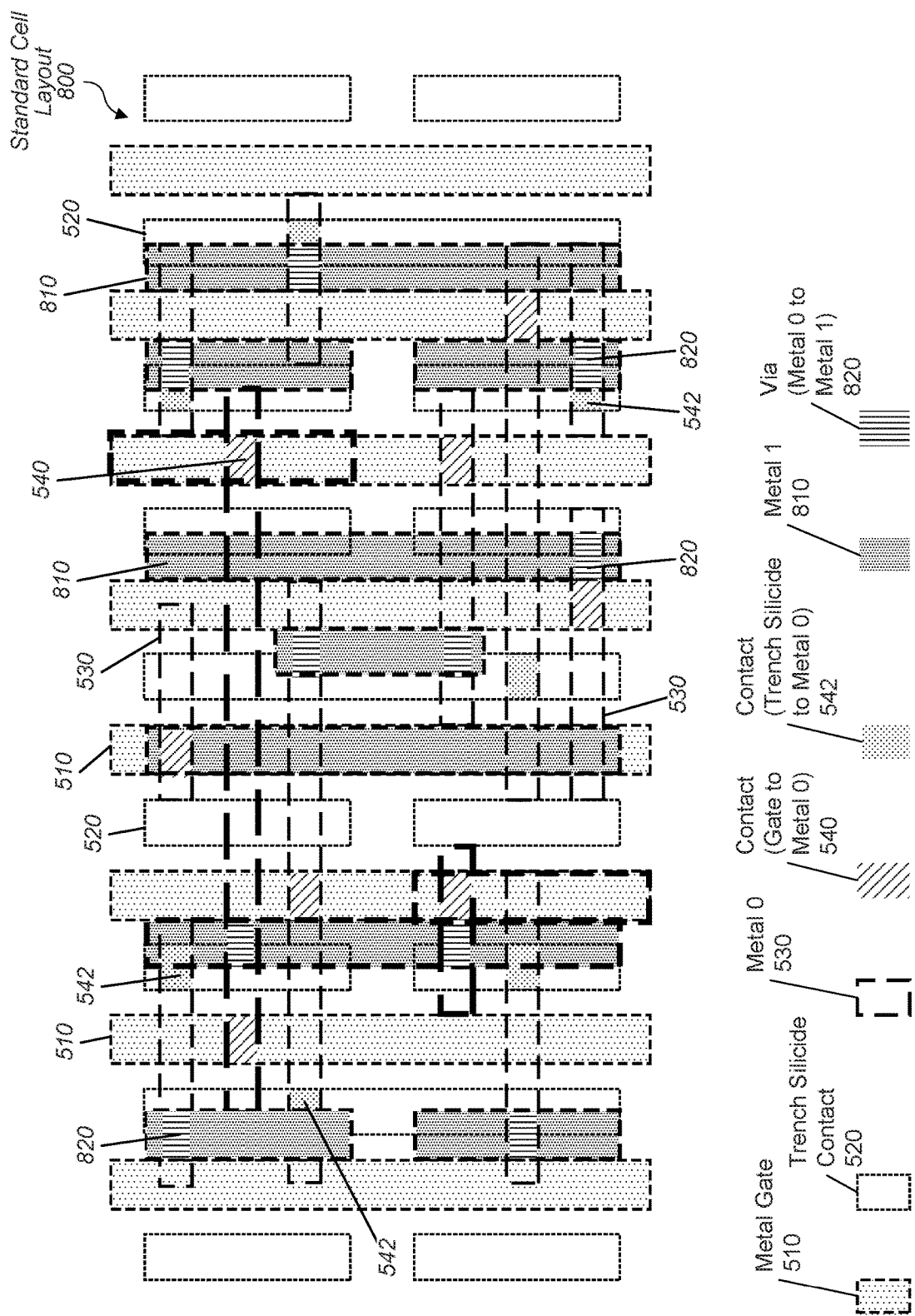
FIG. 8 is a generalized diagram of a top view of a standard cell layout for a six device multiplexer.

Referring to FIG. 8, a generalized block diagram of a top view of a standard cell layout 800 is shown. Layout elements described earlier are numbered identically. Here, the layout 800 is the same as the layouts 500, 600 and 700, but layout 800 additionally uses metal 1 (M1 or Metal1) 810 for local interconnections in the vertical direction and vias 820 for connecting the horizontal interconnect Metal0 530 to the vertical interconnect Metal1 810. It is noted no metal layers (horizontal Metal0 530 and vertical Metal1 810) use bends or L-shapes in the signal routes. Metal layers with no bends or L-shapes are referred to as unidirectional layers. For example, the horizontal Metal0 530 remains horizontal and does not bend toward a vertical direction. Similarly, the vertical Metal1 810 remains vertical and does not bend toward a horizontal direction.

In addition, the layout 800 uses a cross-coupled route with Metal0 530, the via 820 and Metal1 810. There is no use of an additional higher-level metal layer such as Metal 2. Therefore, the highest metal layer used in the route is Metal1 810. The cross-coupled gate connection is highlighted with the bolder lines. As shown, a cross-coupled route traverses between a gate contact of a first transistor and a gate contact of a second transistor. In various embodiments, the second transistor is a different type of transistor than the first transistor. For example, a cross-coupled inverter uses a first cross-coupled route between a gate contact of a first pmos transistor and a gate contact of a first nmos transistor in addition to a second cross-coupled route between a gate contact of a second nmos transistor and a gate contact of a second pmos transistor.

Figure 9:
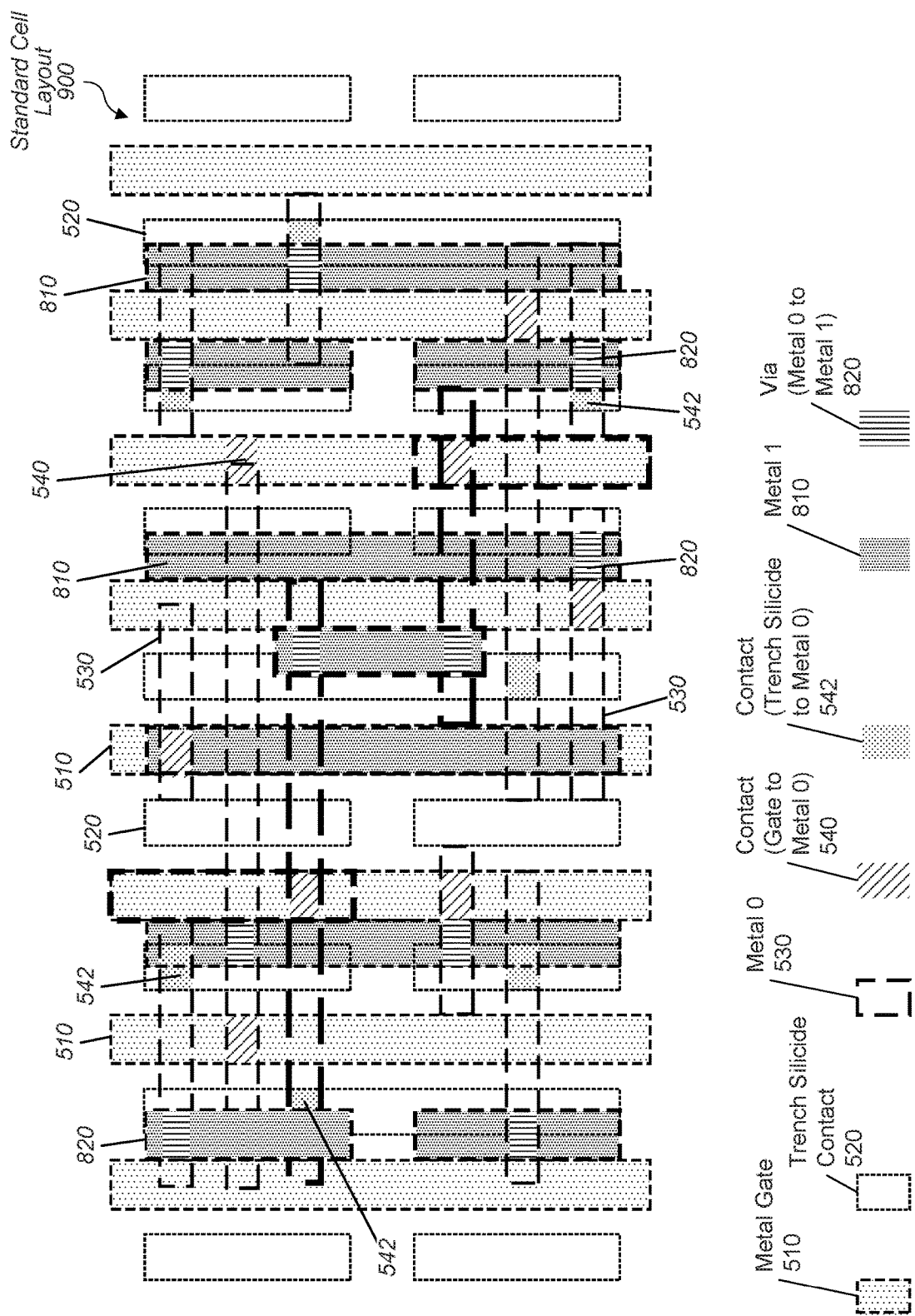
FIG. 9 is a generalized diagram of a top view of a standard cell layout for a six device multiplexer.

Referring to FIG. 9, a generalized block diagram of a top view of a standard cell layout 900 is shown. Layout elements described earlier are numbered identically. Here, the layout 900 is the same as the layout 800. As described earlier, layout 800 highlights a first cross couple gate connection with Metal1 810 and no use of an additional metal layer such as Metal 2. Layout 900 highlights a second cross couple gate connection with Metal1 810 and no use of an additional metal layer such as Metal 2. The second cross couple gate connection is highlighted with the bolder lines. The metal layers are unidirectional similar to the metal layers in layout 800.

Figure 10:
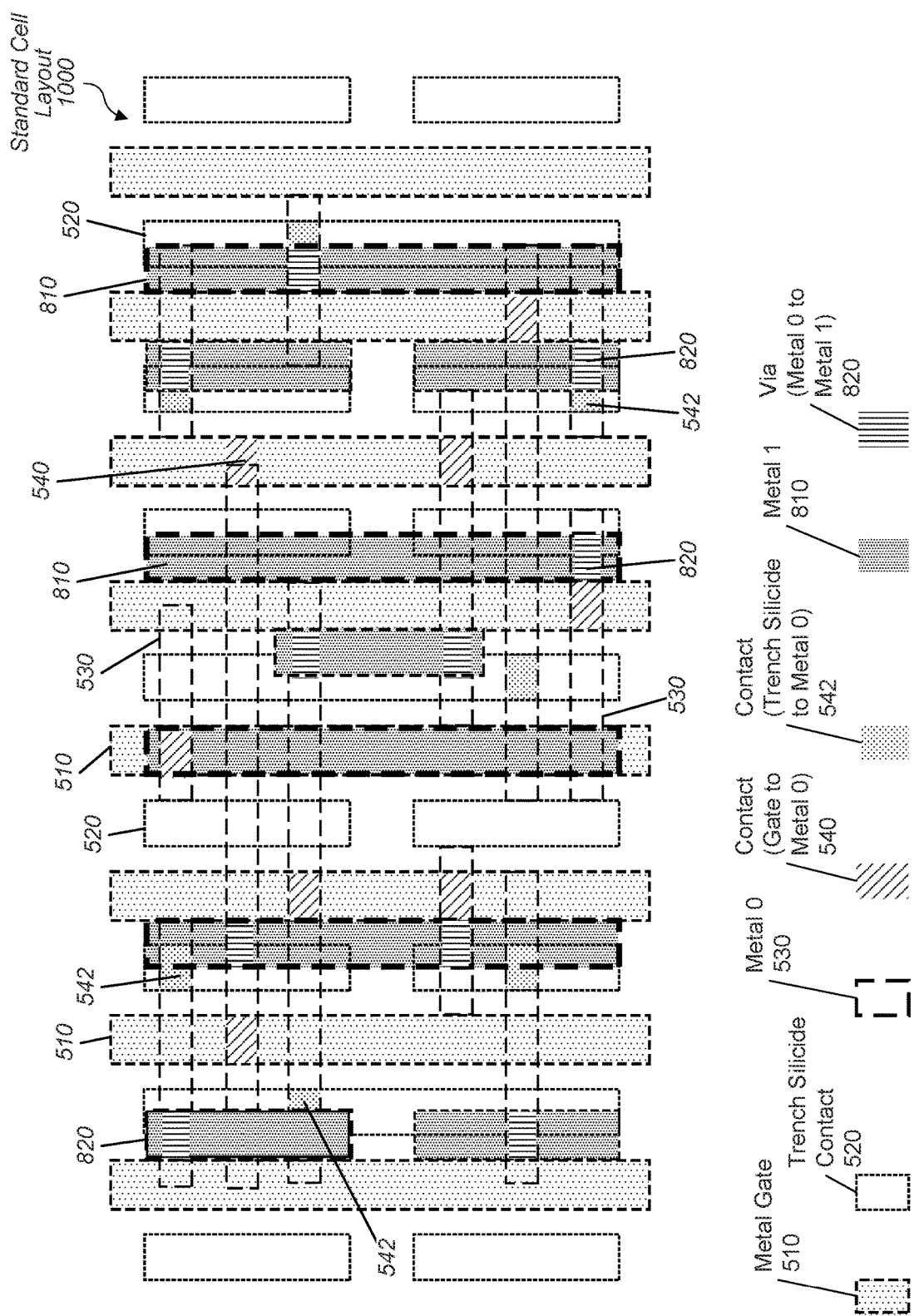
FIG. 10 is a generalized diagram of a top view of a standard cell layout for a six device multiplexer.

Referring to FIG. 10, a generalized block diagram of a top view of a standard cell layout 1000 is shown. Layout elements described earlier are numbered identically. Here, the layout 1000 is the same as the layouts 800 and 900. With bolder lines, layout 1000 highlights the four input and output pins with the tall vertical Metal1 810 routing, which allow for relatively high pin access availability.

Figure 11:
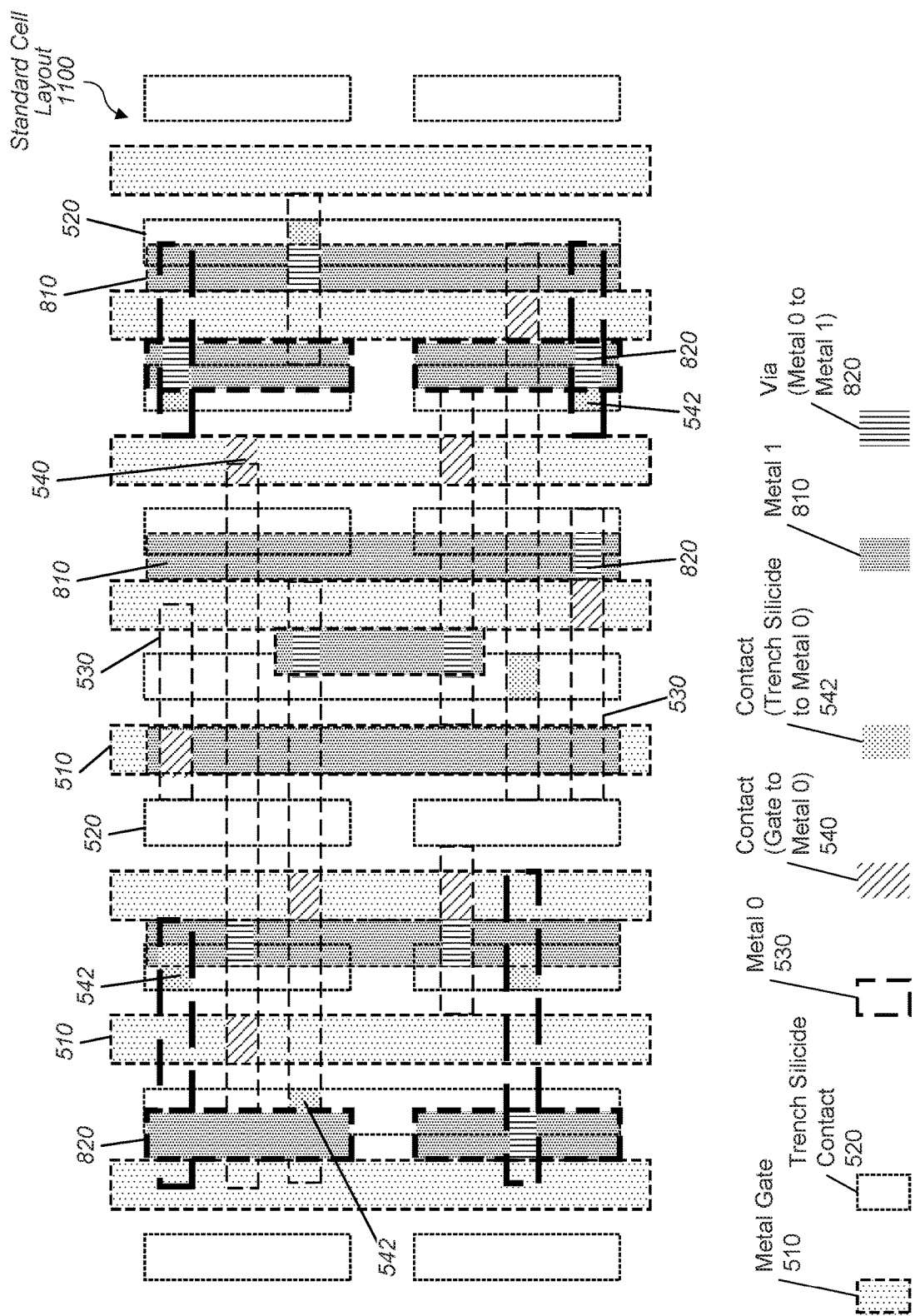
FIG. 11 is a generalized diagram of a top view of a standard cell layout for a six device multiplexer.

Referring to FIG. 11, a generalized block diagram of a top view of a standard cell layout 1100 is shown. Layout elements described earlier are numbered identically. Here, the layout 1100 is the same as the layouts 800, 900 and 1000. With bolder lines, layout 1100 highlights the power pins at the top and the ground pins at the bottom. As shown, layout 1100 does not use end-to-end power rails anywhere let alone in Metal0 530. The Metal1 810 highlighted routing at the top provides flexible connection to Metal 2 tracks for creating power connections. The Metal1 810 highlighted routing at the bottom provides flexible connection to Metal 2 tracks for creating ground connections. The flexible connections are used instead of end-to-end rails.

Figure 12:
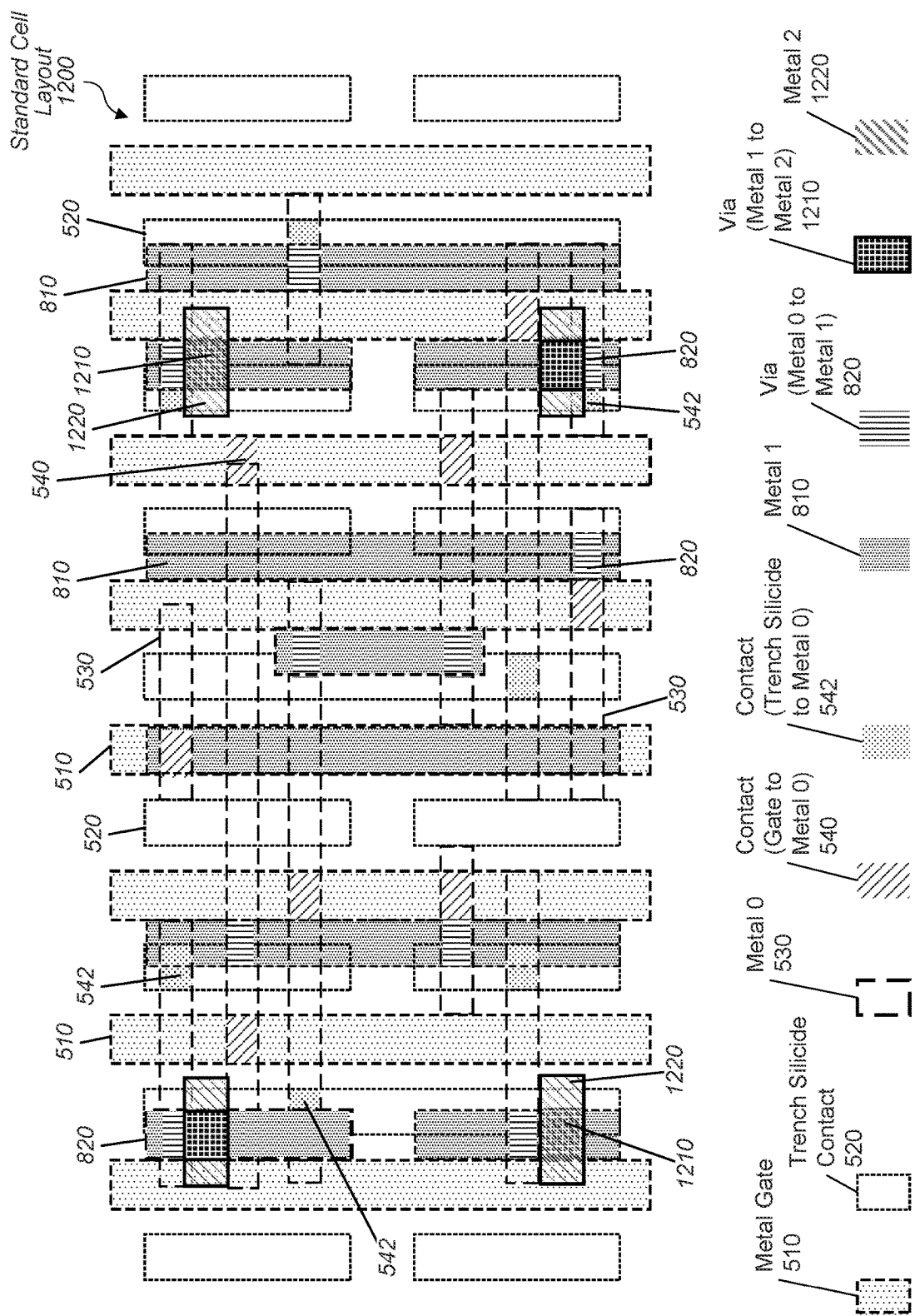
FIG. 12 is a generalized diagram of a top view of a standard cell layout for a six device multiplexer.

Referring to FIG. 12, a generalized block diagram of a top view of a standard cell layout 1200 is shown. Layout elements described earlier are numbered identically. Here, the layout 1200 is the same as the layouts 800, 900, 1000 and 1100, but layout 1200 additionally uses metal 2 (M2 or Metal2) 1220 and via 1210 for connecting Metal1 810 to Metal2 1220. The Metal2 1220 posts on the vias 1210 are optional. In various embodiments, the post location are not be fixed at the chip level and the post location is optional inside the standard cells.

Figure 13:
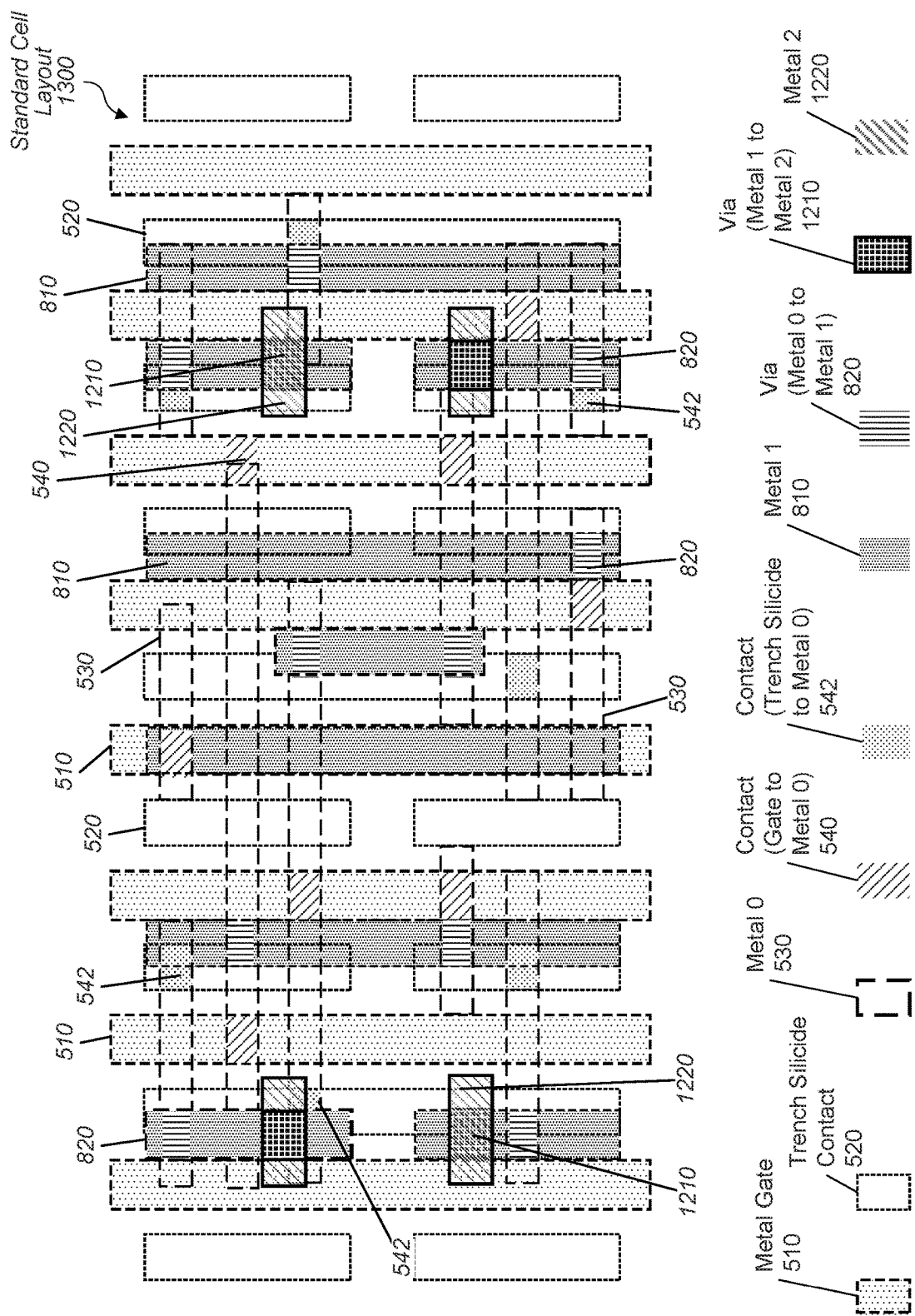
FIG. 13 is a generalized diagram of a top view of a standard cell layout for a six device multiplexer.

Referring to FIG. 13, a generalized block diagram of a top view of a standard cell layout 1300 is shown. Layout elements described earlier are numbered identically. Here, the layout 1300 is the same as the layout 1200. Similar to the layout 1200, the post locations for the power connections at the top and the ground connections at the bottom are not be fixed at the chip level and can be moved inside the standard cells. Here in layout 1300, the placement of the vias 1210 and the optional Metal2 1220 posts are different from the placement used in the layout 1200. The Metal1 810 routing is used to provide flexible placement of the connections for power and ground.

Figure 14:
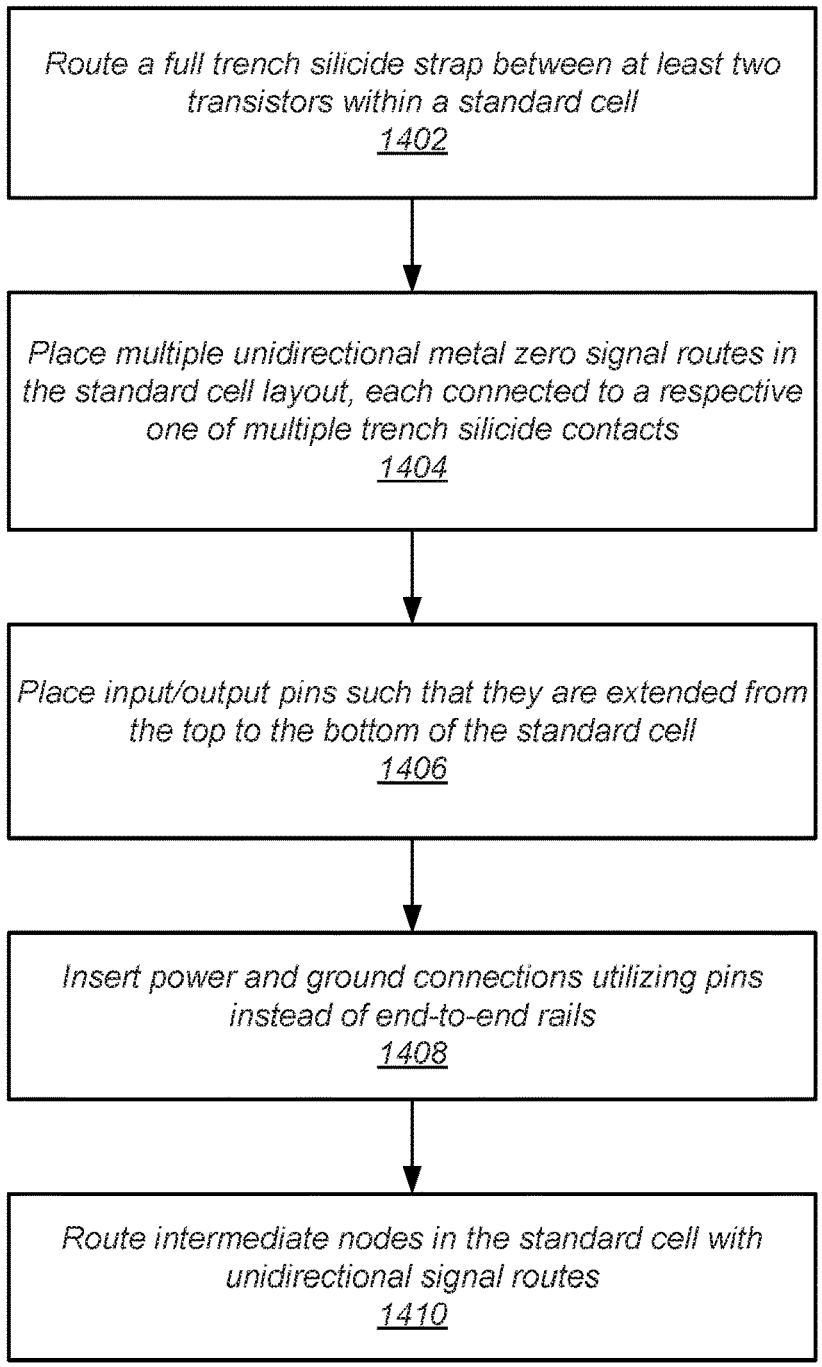
FIG. 14 is a generalized diagram of a method for creating layout for a standard cell.

Referring now to FIG. 14, one embodiment of a method 1400 for creating layout for a standard cell is shown. For purposes of discussion, the steps in this embodiment are shown in sequential order. However, in other embodiments some steps occur in a different order than shown, some steps are performed concurrently, some steps are combined with other steps, and some steps are absent.

A full trench silicide strap is routed between at least two transistors in a standard cell (block 1402). As described earlier, the full trench silicide strap is a single, uninterrupted, trench silicide contact formed as a drain region of at least two separate transistors. In other words, the full trench silicide strap is a single conductive layer that is physically uninterrupted by another conductive layer as it traverses at least two different active regions. In an embodiment, the at least two separate transistors are a pmos transistor in a p-type active region and an nmos transistor in an n-type active region. In some embodiments, the full trench silicide strap is used as an intermediate output node within the standard cell. By not using any other conductive layer for the route, routing congestion is reduced within the standard cell. In various embodiments, the full trench silicide strap is a unidirectional strap since it has no bends in its routing. In one embodiment, a self-aligned gate and local interconnect process in addition to a gate open contact process is used to create the full trench silicide strap.

Multiple unidirectional metal zero signal routes are placed in the standard cell layout, each connected to a respective one of multiple trench silicide contacts (block 1404). In some embodiments, an extreme ultraviolet lithography (EUV) technique is used to provide the resolution of each of the width and the pitch of these unidirectional metal zero signal routes. In some embodiments, a number of unidirectional metal zero signal routes placed in a p-type active region of the standard cell is equal to a number of unidirectional metal zero signal routes placed in an n-type active region of the standard cell. As shown earlier in FIGS. 5-13, the standard cell layouts 500-1300 included three unidirectional metal zero signal routes placed in each of the p-type active region and the n-type active region. These unidirectional metal zero signal routes are shown in groups 610 and 620. However, in other embodiments, any number of unidirectional metal zero signal routes are possible and contemplated. In an embodiment, areas outside the trench silicide contacts are available for signal routing and power and ground connections using metal zero.

One or more input/output pins are placed such that the input/output pins are extended from the top to the bottom of the standard cell (block 1406). In various embodiments, a highest metal layer used for the input/output pins is metal one. In some embodiments, the input/output pins are unidirectional routes in metal one. Power and ground connections utilizing pins instead of end-to-end rails are inserted in the standard cell (block 1408). Intermediate nodes in the standard cell are routed with unidirectional signal routes within corresponding unidirectional tracks (block 1410). The use of unidirectional signal routes is possible due to the above layout steps. Therefore, routing congestion is reduced, standard cell placement is flexible and multiple cell heights are available.

The standard cell layouts 500-1300 and method 1400 shown above provide full trench silicide straps providing more efficient cell signal routing and horizontal groups in Metal0 530. In addition, there are no contacted poly pitch (CPP) slips present. Dual or more height cells are available for optional use as the cell placement is not constrained by horizontal Metal0 530 power rails and vertical Metal1 810 power posts as used in the past technologies. Further, output pins can now be connected in local interconnect rather than by horizontal Metal0 530 and vertical Metal1 810 as in the past technologies. The additional Metal0 530 tracks located above, below and in between the horizontal groups 610 and 620 are available for chip level routing and addition cell connections to optimize performance or enhance DFM yield. The Metal0 530 layer can take advantage of Blech lengths for better electromigration (EM) tolerance/margin. Power rails can now be inboard on smaller track libraries that were not possible on past technologies due to cost or immersion lithography techniques.

The layouts 500-1300 and method 1400 are based on a new standard cell drawing style to build efficient standard cells with no CPP slips, and inboard power rails and completed layouts in M1 with EUV lithography. This new technology will improve chip level routing and allow for a more efficient power grid design to be created that avoid some of the cell placement area. Existing solutions are not using aggressive metal zero patterning or scaling to achieve better scaling with groups of wires in the standard cells. EUV and new Immersion/Process techniques are enabling new and more efficient constructs to help with scaling.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A standard cell layout comprising:
    a plurality of transistors;
    one or more trench silicide contacts, each formed on one end of a gate region as a source region or a drain region of a respective transistor of the plurality of transistors;
    one or more full trench silicide straps, wherein each of the full trench silicide straps is a trench silicide contact formed as a single drain region for two separate transistors of the plurality of transistors, each of the two separate transistors further comprising a respective source region and channel region; and
    a plurality of unidirectional signal routes in a metal zero layer, wherein each route connects to a respective one of the one or more trench silicide contacts.

2. The standard cell layout as recited in claim 1, wherein each of the one or more full trench silicide straps is a unidirectional strap.

3. The standard cell layout as recited in claim 1, wherein each of the plurality of unidirectional signal routes in the metal zero layer traverses no other metal layer before reaching the metal zero layer from the respective one of the one or more trench silicide contacts.

4. The standard cell layout as recited in claim 1, wherein the layout further comprises a cross-coupled route between a drain contact of a first transistor and a gate contact of a second transistor, wherein a highest metal layer in the route is metal one.

5. The standard cell layout as recited in claim 1, wherein the layout further comprises one or more output pins extended from a top to a bottom of the standard cell, wherein a highest metal layer used for each of the one or more output pins is metal one.

6. The standard cell layout as recited in claim 5, wherein at least one of the one or more output pins is routed in a unidirectional manner from the top area to the bottom area of the standard cell.

7. The standard cell layout as recited in claim 1, wherein the layout further comprises power and ground connections utilizing pins instead of end-to-end rails.

8. The standard cell layout as recited in claim 1, wherein one or more of signal routing and power and ground connections using metal zero are placed in areas outside the one or more trench silicide contacts.

9. A method comprising:
    forming one or more trench silicide contacts, each is a trench silicide contact formed as a source region or a drain region of a respective transistor of a plurality of transistors;
    forming one or more full trench silicide straps, wherein each of the full trench silicide straps is a trench silicide contact formed as a single drain region for two separate transistors of the plurality of transistors, each of the two separate transistors further comprising a respective source region and channel region; and
    routing a plurality of unidirectional signal routes in a metal zero layer, wherein each route connects to a respective one of the one or more trench silicide contacts.

10. The method as recited in claim 9, wherein each of the one or more full trench silicide straps is a unidirectional strap.

11. The method as recited in claim 9, wherein each metal layer track in the standard cell is a unidirectional track.

12. The method as recited in claim 9, wherein a highest metal layer in a cross-coupled route between a drain contact of a first transistor and a gate contact of a second transistor is metal one.

13. The method as recited in claim 9, wherein a highest metal layer used for each of one or more output pins extended from a top to a bottom of the standard cell is metal one.

14. The method as recited in claim 9, wherein power and ground connections utilize pins instead of end-to-end rails.

15. A non-transitory computer readable storage medium storing a plurality of instructions which, when executed, generate an integrated circuit layout that comprises:
    a plurality of transistors;
    one or more trench silicide contacts, each is a trench silicide contact formed on one end of a gate region as a source region or a drain region of a respective transistor of the plurality of transistors;
    one or more full trench silicide straps, wherein each of the full trench silicide straps is a trench silicide contact formed as a single drain region for two separate transistors of the plurality of transistors, each of the two separate transistors further comprising a respective source region and channel region; and a plurality of unidirectional signal routes in a metal zero layer, wherein each route connects to a respective one of the one or more trench silicide contacts.

16. The non-transitory computer readable storage medium as recited in claim 15, wherein each of the one or more full trench silicide straps is a unidirectional strap.

17. The non-transitory computer readable storage medium as recited in claim 15, wherein each of the plurality of unidirectional signal routes in the metal zero layer traverses no other metal layer before reaching the metal zero layer from the respective one of the one or more trench silicide contacts.

18. The non-transitory computer readable storage medium as recited in claim 15, wherein a highest metal layer in a cross-coupled route between a drain contact of a first transistor and a gate contact of a second transistor is metal one.

19. The non-transitory computer readable storage medium as recited in claim 15, wherein a highest metal layer used for each of one or more output pins extended from a top to a bottom of the standard cell is metal one.

20. The non-transitory computer readable storage medium as recited in claim 15, wherein power and ground connections utilize pins instead of end-to-end rails.

* * * * *